United States Patent
Wei et al.

(10) Patent No.: US 10,685,883 B1
(45) Date of Patent: Jun. 16, 2020

(54) METHOD OF WAFER DICING AND DIE

(71) Applicant: Winbond Electronics Corp., Taichung (TW)

(72) Inventors: Cheng-Hong Wei, Taichung (TW); Hung-Sheng Chen, Taichung (TW); Ching-Wei Chen, Taichung (TW); Shuo-Che Chang, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/402,216

(22) Filed: May 2, 2019

(51) Int. Cl.
| | |
|---|---|
| *H01L 21/78* | (2006.01) |
| *H01L 23/544* | (2006.01) |
| *H01L 23/00* | (2006.01) |
| *H01L 21/3065* | (2006.01) |
| *H01L 21/311* | (2006.01) |
| *H01L 21/3213* | (2006.01) |
| *H01L 21/66* | (2006.01) |

(52) U.S. Cl.
CPC .......... *H01L 21/78* (2013.01); *H01L 21/3065* (2013.01); *H01L 21/31116* (2013.01); *H01L 21/32136* (2013.01); *H01L 22/32* (2013.01); *H01L 23/544* (2013.01); *H01L 23/562* (2013.01); *H01L 2223/5446* (2013.01)

(58) Field of Classification Search
CPC ............................. H01L 21/78; H01L 23/544
See application file for complete search history.

(56) References Cited

U.S. PATENT DOCUMENTS

| | | | | |
|---|---|---|---|---|
| 7,130,049 | B2 * | 10/2006 | Consolini | ............. G03F 9/7003 356/399 |
| 8,563,393 | B2 * | 10/2013 | Eguchi | .................. H01L 23/544 257/E23.179 |
| 9,443,807 | B2 * | 9/2016 | Zundel | .................... H01L 22/12 |
| 2019/0101839 | A1 * | 4/2019 | Janda | .................. G03F 7/70775 |

* cited by examiner

*Primary Examiner* — William Coleman
(74) *Attorney, Agent, or Firm* — JCIPRNET (57) ABSTRACT

A method of wafer dicing and a die are provided. The method includes the following processes. A wafer is provided, the wafer includes a plurality of die regions and a scribe region between the die regions. The scribe region includes a substrate, and a dielectric layer and a test structure on the substrate, the test structure is disposed in the dielectric layer. A first removal process is performed to remove the test structure and the dielectric layer around the test structure, so as to expose the substrate. The first removal process includes performing a plurality of etching cycles, and each etching cycle includes performing a first etching process to remove a portion of the test structure and performing a second etching process to remove a portion of the dielectric layer. A second removal process is performed to remove the substrate in the scribe region, so as to form a plurality of dies separated from each other.

12 Claims, 10 Drawing Sheets

METHOD OF WAFER DICING AND DIE

BACKGROUND

Technical Field

The embodiments of the disclosure relates to a method of wafer dicing and a die.

Description of Related Art

After the fabrication of a wafer is completed, dicing technique is used to cut the wafer into a plurality of individual dies along the scribe line. Current wafer dicing techniques include, for example, mechanical dicing such as dicing using a blade, laser dicing, plasma dicing or the like.

With the miniaturization of the critical dimension of the semiconductor device, more dies can be formed on a single wafer, thereby making the width of the scribe line smaller and smaller, and the path length of the scribe line is also increased. If laser dicing or mechanical dicing is used to cut the wafer, since the laser beam and the dicing tool themselves have a certain width, the die region adjacent to the scribe line may be damaged when the width of the scribe line is small. In other words, it is difficult to use laser dicing or mechanical dicing to cut a wafer having scribe line of small size. On the other hand, the time required to cut the wafer using laser dicing or mechanical dicing is greatly extended as the path length of the scribe line increases, as such, the cost of wafer dicing is increased.

Furthermore, when the wafer is cut by mechanical dicing, there may be an issue of wafer chipping or cracking due to the mechanical stress generated by the dicing tool, which may cause the damage of the die. When the wafer is cut by laser dicing, the thermal effect of the laser may be transmitted to the die region to adversely affect the die. Moreover, after laser dicing and mechanical dicing, the sidewalls of the die usually have rough surfaces.

Figure 1A:
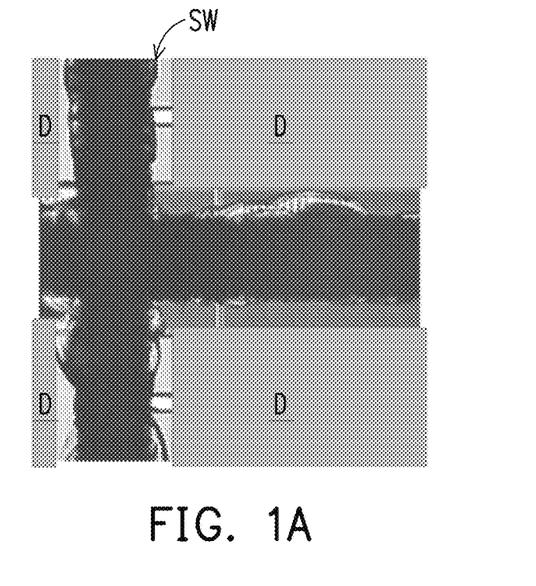
FIG. 1A illustrates a scanning electron microscope (SEM) image of a die cut from a wafer by a conventional mechanical dicing method.
Figure 1B:
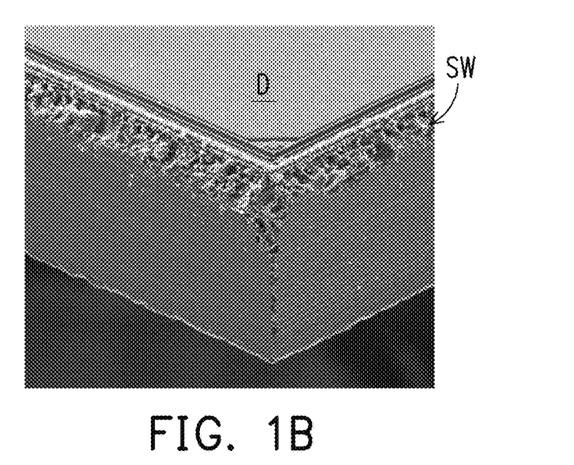
FIG. 1B illustrates a SEM image of a die cut from a wafer by a conventional laser dicing method.
Figure 1C:
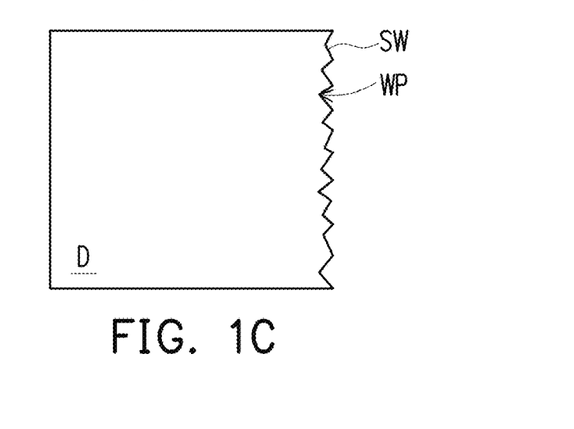
FIG. 1C is a schematic cross-sectional view of a die cut from a wafer by a conventional mechanical or laser dicing method.

FIG. 1A illustrates a scanning electron microscope (SEM) image of a top view of a die after the wafer is diced using a blade. FIG. 1B illustrates a SEM image of the surface of a die after laser dicing. FIG. 1C illustrates a schematic cross-sectional view of a sidewall of a die D after mechanical or laser dicing.

Referring to FIG. 1A to FIG. 1C, a sidewall SW of the die D has an uneven and rough surface after mechanical or laser dicing. Such a rough sidewall SW has points (such as the point WP) where stress is easily concentrated, when the die D is subjected to stress, the stress is easily concentrated at the point WP, as such, the die D is easy to be cracked from the point WP. The point WP can also be referred to as a weak point WP.

Compared to mechanical and laser dicing, plasma dicing not only can dice a wafer having a scribe line of small size, but also reduce the time required for dicing. On the other hand, the sidewalls of the die may have a flat surface through plasma dicing, thereby increasing the strength of the die. However, since the scribe line includes a complex structure of multilayers of metal features of test devices and insulating or dielectric features, how to use plasma dicing to remove the complex structure of the test device and the surrounding insulating features in the scribe line is still a problem need to be solved currently.

SUMMARY

The disclosure provides a method of wafer dicing and a die formed using the method, the method employs multiple etching cycles to remove the complex test structure in the scribe region, and the resulted die can have a flat sidewall.

The embodiments of the disclosure provide a method for cutting a wafer, including the following processes. A wafer is provided, the wafer includes a plurality of die regions and a scribe region between the die regions. The scribe region includes a substrate, and a dielectric layer and a test structure on the substrate, the test structure is disposed in the dielectric layer. A first removal process is performed to remove the test structure and the dielectric layer around the test structure, so as to expose the substrate. The first removal process includes performing a plurality of etching cycles, and each etching cycle includes performing a first etching process to remove a portion of the test structure and performing a second etching process to remove a portion of the dielectric layer. A second removal process is performed to remove the substrate in the scribe region, so as to form a plurality of dies separated from each other.

The embodiments of the disclosure provide a die cut from the wafer using the method of wafer dicing described above, wherein a sidewall of the die has a flat surface.

In view of the above, the disclosure removes the complex test structure in the scribe region by performing a plurality of etching cycles of the first etching process and the second etching process, so that the die cut from the wafer has a flat surface. As such, the strength of the die is increased, and the die is able to withstand greater stress, so as to avoid cracking.

To make the above features and advantages of the disclosure more comprehensible, several embodiments accompanied with drawings are described in detail as follows.

DESCRIPTION OF THE EMBODIMENTS

The invention will be more fully described with reference to the drawings of the embodiments. However, the invention may be embodied in a variety of different forms and should not be limited to the embodiments described herein. The thickness of layers and regions in the drawings may be exaggerated for clarity. The same or similar component numbers indicate the same or similar components. Accordingly, no further description thereof is provided hereinafter.

FIG. 2A to FIG. 2F are schematic cross-sectional views illustrating a method of wafer dicing according to some embodiments of the disclosure. FIG. 3A to FIG. 3F are enlarged schematic views illustrating a method of removing test devices and dielectric layers in a scribe line during wafer dicing according to some embodiments of the disclosure.

Figure 2A:
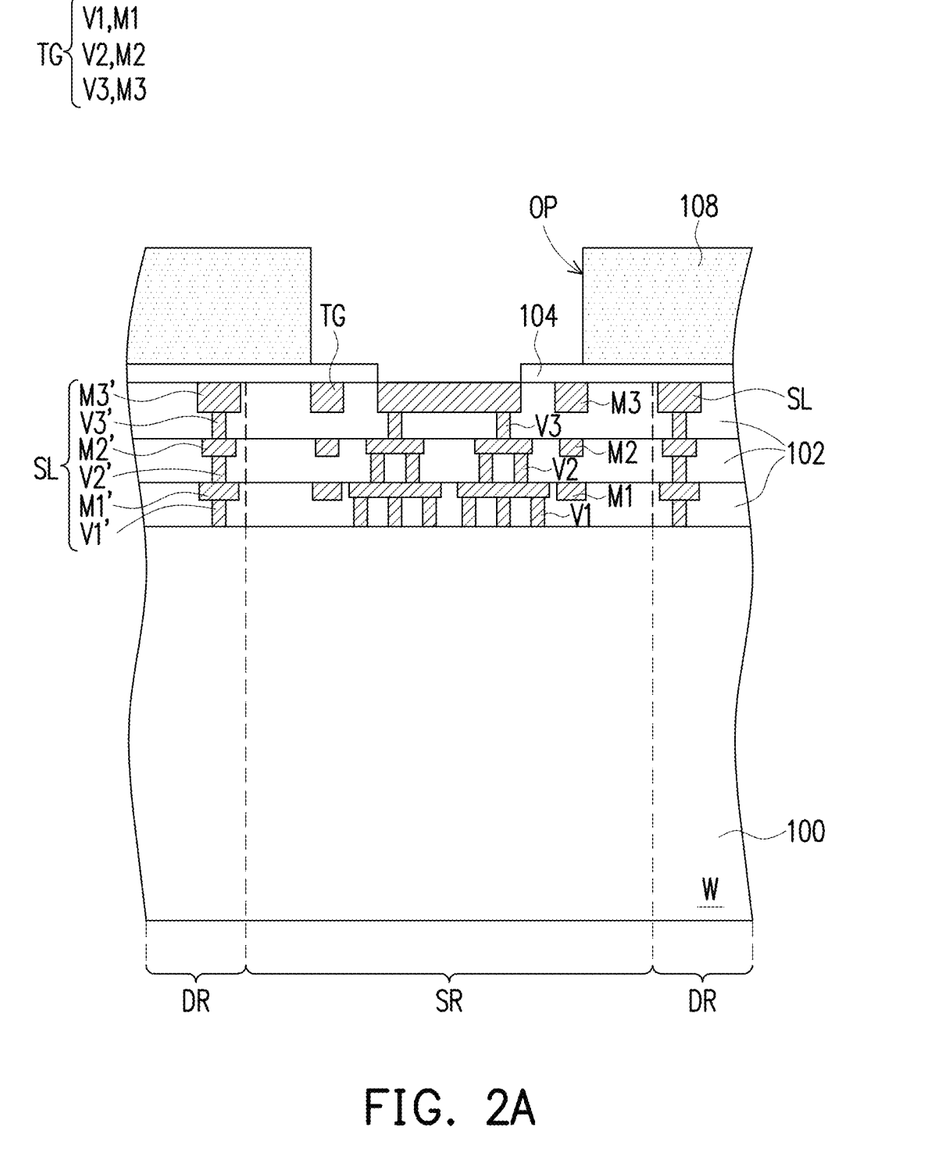
FIG. 2A to FIG. 2F are schematic cross-sectional views illustrating a method of wafer dicing according to some embodiments of the disclosure.

Referring to FIG. 2A, a wafer W is provided. The wafer W includes a substrate 100. The substrate 100 is a semiconductor substrate, such as a doped silicon substrate, an undoped silicon substrate or a semiconductor on insulator (SOI) substrate. The dopant of the doped silicon substrate may be a P-type dopant, an N-type dopant, or a combination thereof. One or multiple layer(s) of dielectric layer 102 are formed over the substrate 100. In an embodiment, multiple layers of dielectric layers 102 are stacked above the substrate 100, and the thicknesses of the respective dielectric layers 102 may be the same or different. The material of the dielectric layer 102 may include silicon oxide, silicon nitride, or a combination thereof.

The wafer W has a plurality of die regions DR and a scribe region SR between the plurality of die regions DR. In an embodiment, the width of the scribe region SR is, for example, 50 μm to 80 μm or 60 μm to 80 μm. In an embodiment, the substrate 100 and the dielectric layers 102 extend from the die regions DR to the scribe region SR.

In an embodiment, the wafer W may include integrated circuit devices, an interconnect structure, and a seal ring SL on and/or in the substrate 100 of the die regions DR. For the sake of brevity, the integrated circuit devices and the interconnect structure are not specifically shown. For example, the die region DR may include active devices, passive devices, or combinations thereof. The active devices include, for example, transistors, diodes, or the like, or combinations thereof. The passive devices include, for example, capacitors, inductors, resistors, or the like, or combinations thereof. The interconnect structure includes a plurality of conductive features disposed in the dielectric layers 102. The conductive features include multilayers of conductive lines and conductive vias or plugs electrically connected to each other, for example. The interconnect structure is electrically connected to different integrated circuit devices to form functional circuits. In an embodiment, the interconnect structure comprises copper, aluminum, tungsten, alloys thereof, or combinations thereof.

The seal ring SL is formed in the dielectric layers 102 and is located at the edges of the die regions DR and adjacent to the scribe region SR, so as to protect the components such as the integrated circuit devices and the interconnect structure in the die region DR within the seal ring SL.

In an embodiment, the seal ring SL includes multilayers of vias and metal lines stacked alternately from bottom to top. For example, the seal ring SL includes a via V1' and a metal line M1', a via V2' and a metal line M2', and a via V3' and a metal line M3', but the disclosure is not limited thereto. The number of the layers of the vias and metal lines in the seal ring SL may be adjusted according to the product design and requirement. In an embodiment, the material of the seal ring SL includes copper, aluminum, tungsten, alloys thereof, or combinations thereof.

In an embodiment, a test element group (TEG) TG for the wafer test is disposed on the substrate 100 in the scribe region SR. The test element group TG may also be referred to as a test structure TG. The test structure TG is located in the dielectric layers 102 and is spaced apart from the seal ring SL by the dielectric layers 102. In an embodiment, the spacing between the test structure TG and the seal ring SL is about 5 μm.

In an embodiment, the test structure TG includes a plurality of vias and metal lines alternately stacked on the substrate 100 and electrically connected to each other. For example, the test structure TG may include vias V1 and metal lines M1, vias V2 and metal lines M2, vias V3 and metal lines M3 located in the dielectric layer 102 from bottom to top. In an embodiment, the metal line M3 is the top metal feature of the test structure TG, and the top surface of the metal line M3 may be substantially level with the top surface of the dielectric layer 102 in the scribe region SR, but the disclosure is not limited thereto. It is noted that the number of layers of the vias and metal lines in the test structure TG shown in the figures is merely for illustration, and the disclosure is not limited thereto. The number of layers of the vias and metal lines included in the test structure TG may be adjusted according to the object to be tested. In an embodiment, the material of the test structure TG includes copper, aluminum, tungsten, alloys thereof, or combinations thereof.

In an embodiment, the test structure TG and the seal ring SL may be formed simultaneously with the interconnect structure in the die region DR and electrically isolated from the interconnect structure. In other words, the seal ring SL and the test structure TG are electrically floating.

Still referring to FIG. 2A, in an embodiment, the wafer W further includes a protection layer 104 over the dielectric layer 102. The protection layer 104 extends from the die regions DR to the scribe region SR, covering the top surface of the dielectric layer 102, the top surface of the seal ring SL, and at least a portion of the top surface of the test structure TG. A portion of the top surface of the metal line M3 of the test structure TG is exposed by the protection layer 104. The exposed top surface of the metal line M3 may be used for the electrical testing of the wafer W, for example. The material of the protection layer 104 may be the same as or different from the material of the dielectric layer 102. For example, the material of the protection layer 104 may include silicon oxide, silicon nitride, or a combination thereof.

Still referring to FIG. 2A, a patterned mask layer 108 having an opening OP is formed over the substrate 100. The patterned mask layer 108 is, for example, a patterned photoresist layer. In an embodiment, the patterned mask layer 108 covers the die regions DR and a portion of the scribe region SR adjacent to the die regions DR. The opening OP is directly above the test structure TG, exposing a portion of the protection layer 104 and the metal line M3 in the scribe region SR. In an embodiment, the width of the opening OP may be slightly less than, equal to, or greater than the width of the test structure TG. For example, the opening OP has a width ranging from 10 μm to 60 μm or 10 μm to 70 μm.

Referring to FIG. 2A to FIG. 2E, a singulation process (or referred to as a dicing process) is performed on the wafer W using the patterned mask layer 108 as a mask, so as to separate the plurality of dies in the wafer W. In an embodiment, the singulation process includes an etching process, such as dry etching, wet etching, or a combination thereof. Dry etching includes plasma etching. In some embodiments in which the singulation process employs plasma etching, the singulation process may be referred to as a plasma dicing process.

Figure 2B:
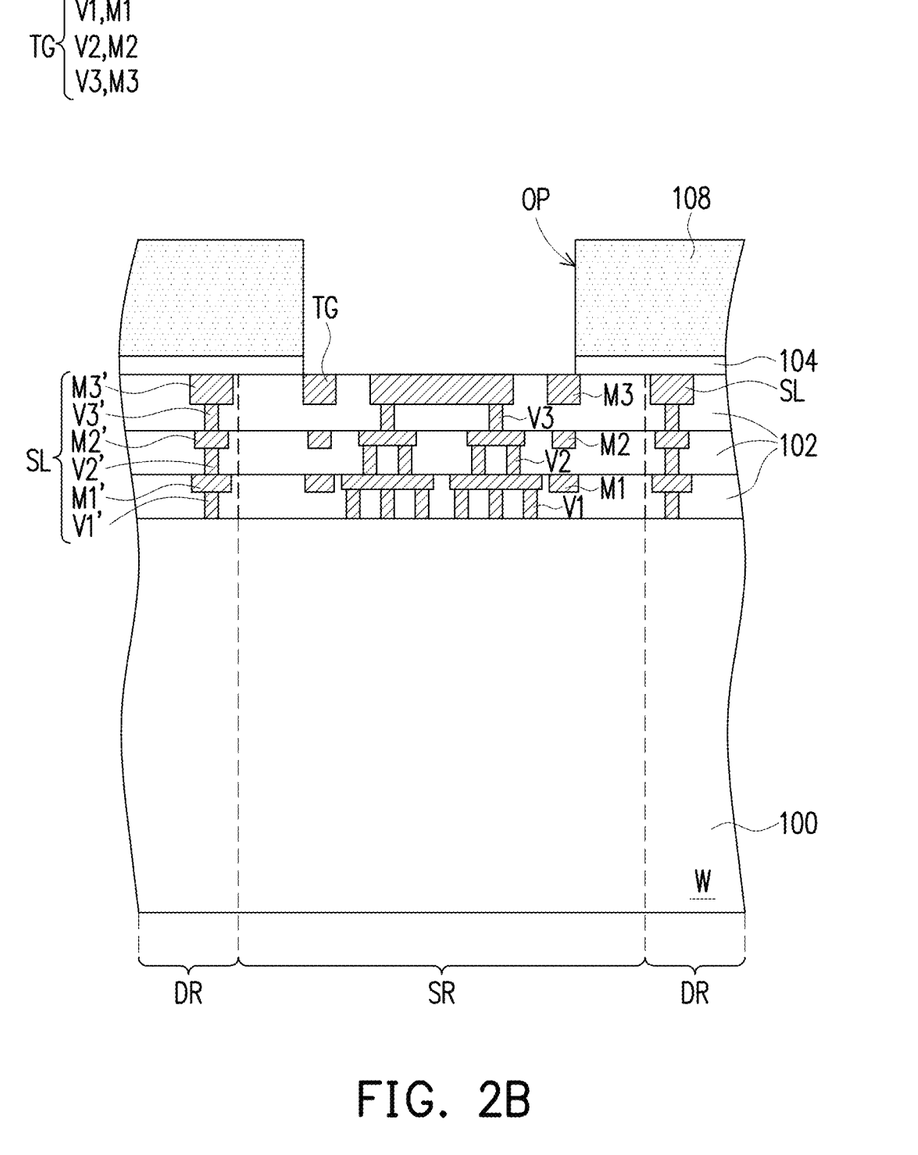

Referring to FIG. 2A to FIG. 2B, an etching process is performed using the patterned mask layer 108 as a mask, so as to at least remove the protection layer 104 located over the metal lines M3, and expose the top surface and/or sidewalls of the metal line M3. In an embodiment, the etching process only removes the protection layer 104 to expose the top surface of the metal line M3 and the top surface of the dielectric layer 102, and the exposed top surfaces of the metal line M3 and the dielectric layer 102 may be level with each other, but the disclosure is not limited thereto. In another embodiment, the etching process may remove the protection layer 104 and a portion of the dielectric layer 102, such that the top surface and the sidewalls of the metal line M3 are exposed, and after the etching process, the top surface of the remained dielectric layer 102 may be lower than the top surface of the metal line M3.

Figure 2C:
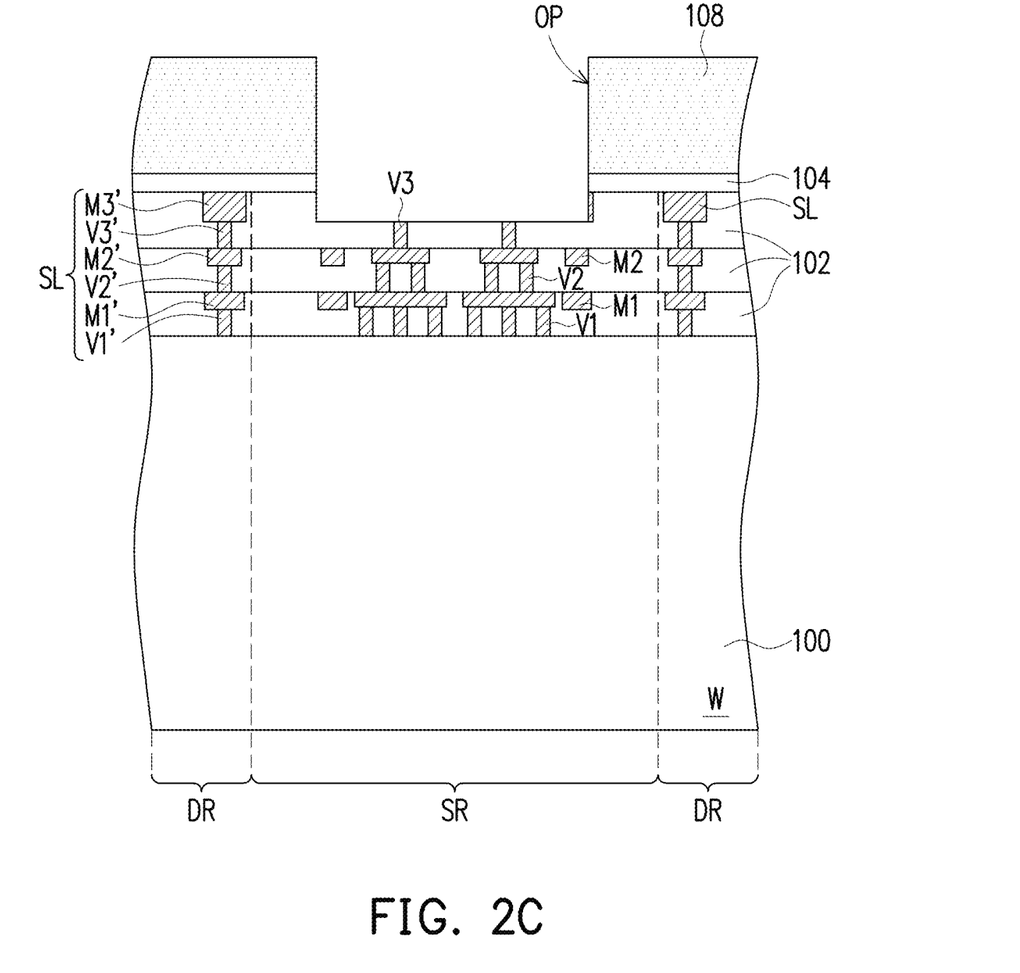
Figure 2D:
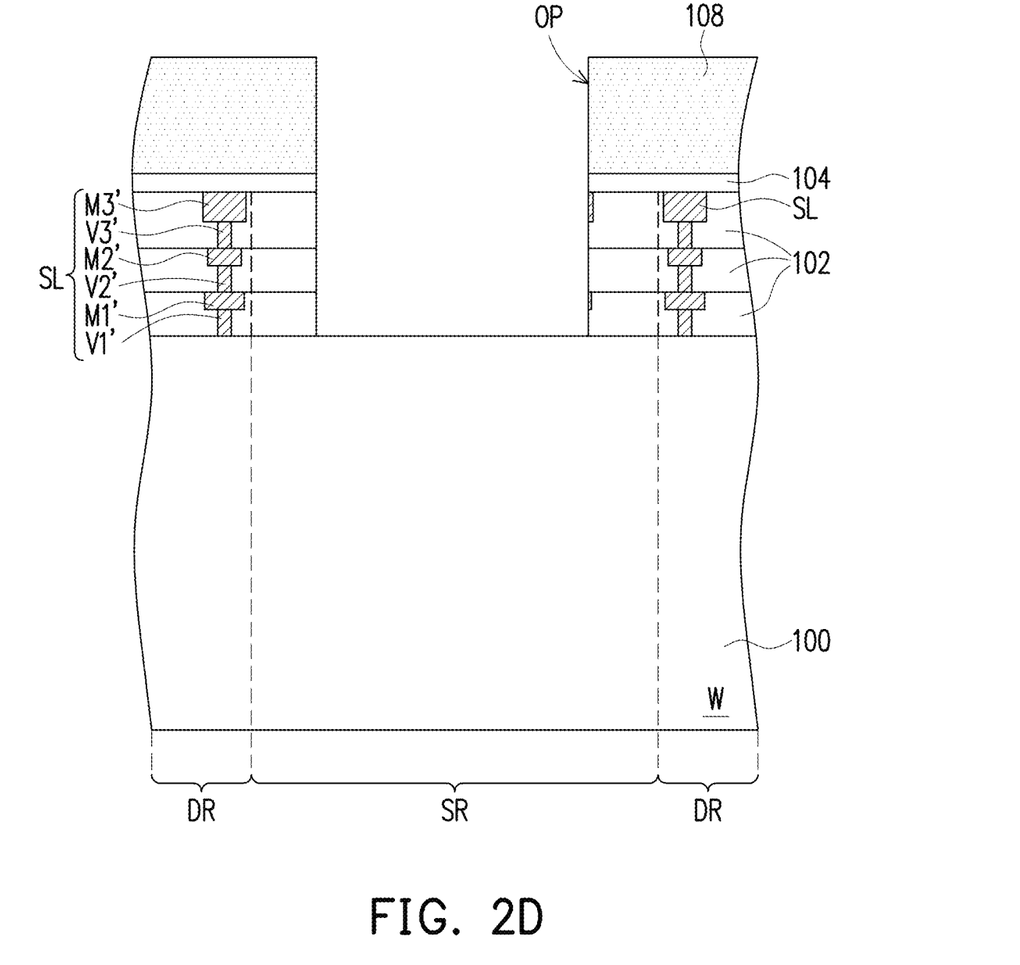

Referring to FIG. 2B and FIG. 2D, a first removal process is then performed to remove the test structure TG and the dielectric layers 102 around thereof. The first removal process may include performing a plurality of etching cycles. Each etching cycle may include a first etching process and a second etching process switched rapidly, the first etching process is performed to etch the test structure TG, and the second etching process is performed to etch the dielectric layer 102. The details are described as below taken the plasma etching as an example.

FIG. 2B and FIG. 2C illustrates the removal of the metal line M3 and dielectric layer 102 surrounding the metal line M3. FIG. 3A to FIG. 3F are enlarged schematic views illustrating a method of removing the metal line M3 and the dielectric layer 102. For the sake of brevity, not all of the components in the wafer W are specifically shown in FIG. 3A to FIG. 3F.

Referring to FIG. 2B to FIG. 2C and FIG. 3A to FIG. 3B, in an embodiment, the metal line M3 has an initial thickness T1, and the dielectric layer 102 has an initial thickness T10. Although the top surface of the metal line M3 is illustrated to be level with the top surface of the dielectric layer 102 in FIG. 2A and FIG. 3A, the disclosure is not limited thereto. In another embodiment, the top surface of the dielectric layer 102 may be lower than the top surface of the metal line M3.

Figure 3A:
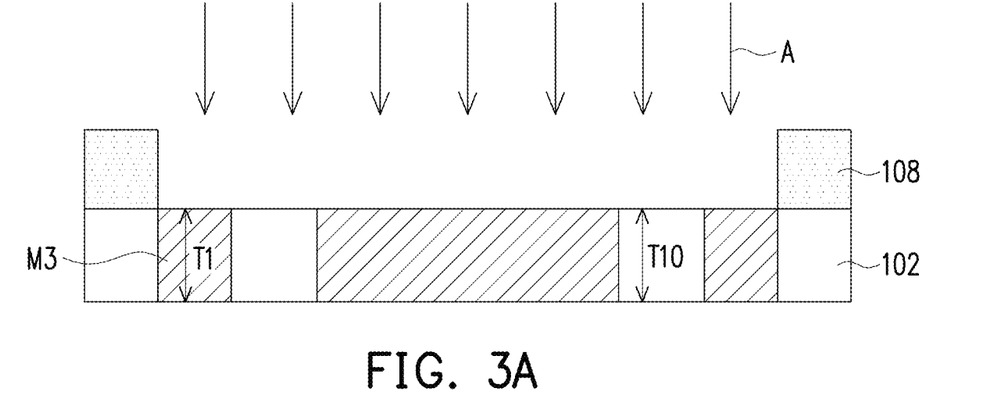
FIG. 3A to FIG. 3F are enlarged schematic views illustrating a method of removing test devices and dielectric layers in a scribe line during wafer dicing according to some embodiments of the disclosure.
Figure 3B:
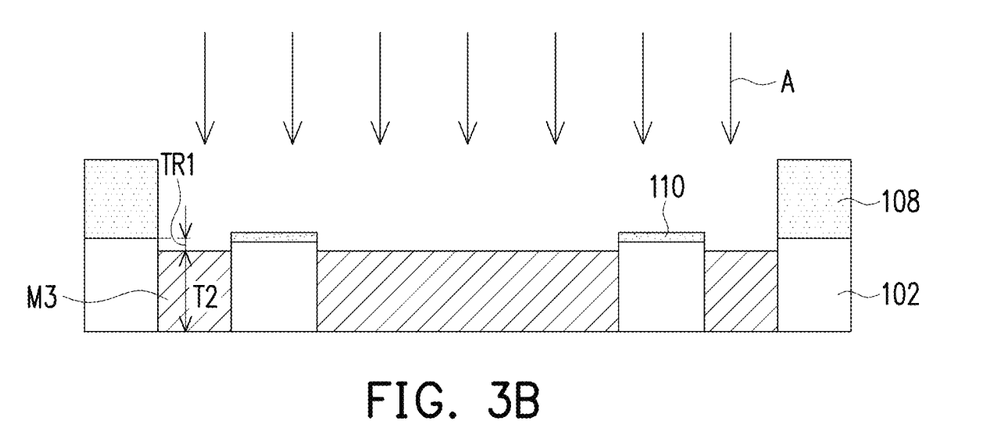

The first etching process is performed on the metal line M3 with the patterned mask layer 108 as a mask. In an embodiment, the first etching process is performed by applying a plasma A to the scribe region SR exposed by the patterned mask layer 108, so as to remove a portion of the metal line M3. The plasma A has a high etching selectivity ratio of the metal line M3 to the dielectric layer 102. In an embodiment, the plasma A is, for example, a chlorine-containing plasma generated by a chlorine-containing gas such as $Cl_2$ or $BCl_3$.

Still referring to FIG. 3A and FIG. 3B, in an embodiment, the introduction duration of the plasma A, that is, the duration of the first etching process is, for example, less than 20 seconds, less than 30 seconds, or less than 50 seconds, and the metal line M3 is removed by a thickness TR1. In an embodiment, the removed thickness TR1 of the metal line M3 is less than the initial thickness T1 of the metal line M3, and the remained metal line M3 has a thickness T2.

Referring to FIG. 3B, in an embodiment, during the etching of the metal line M3 using plasma A, the dielectric layer 102 is also exposed to the plasma A, and a hard skin layer 110 may be formed on the surface of the dielectric layer 102. The hard skin layer 110 may include a polymer product produced by the reaction of the plasma A and the dielectric layer 102, and a byproduct of the etching of the metal line M3. A small amount of hard skin layer 110 can be easily removed in the subsequent etching process of the dielectric layer 102. However, as the introduction duration of the plasma A increases, that is, the duration of the first etching process increases, the size and removal difficulty of the hard skin layer also increases. If the hard skin layer cannot be removed successfully, it will hinder the subsequent etching process, which will increase the difficulty of the process. Therefore, it is necessary to control the introduction duration of the plasma A within a suitable range (e.g., the duration range described above), so that the hard skin layer 110 generated on the dielectric layer 102 can be successfully removed in subsequent etching processes without hindering the progress of the etching process. It should be noted that the suitable introduction duration range of the plasma A is related to the materials of metal line M3 and dielectric layer 102.

Figure 3C:
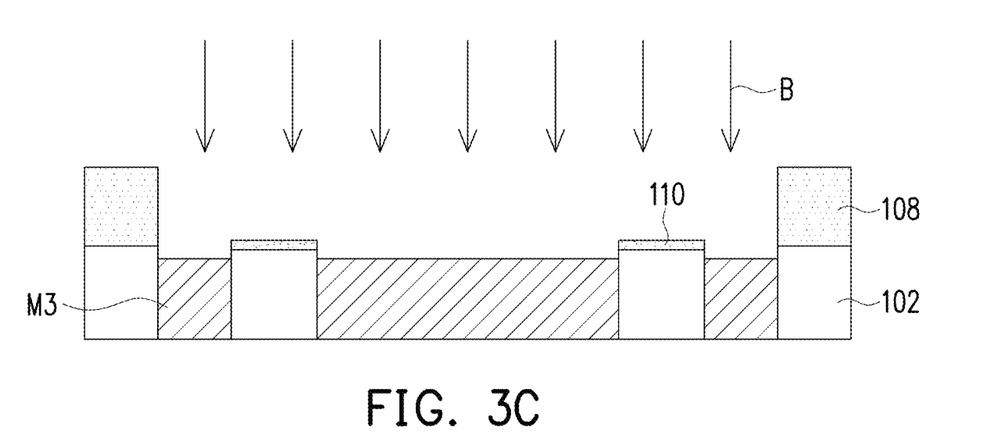

Referring to FIG. 3B and FIG. 3C, stop performing the first etching process, and a second etching process is performed on the dielectric layer 102. For example, stop introducing the etching gas that produces the plasma A, and switch to introducing another etching gas that produces a plasma B, so as to perform a second etching process to remove the dielectric layer 102. The plasma B has a high etching selectivity ratio of the dielectric layer 102 to the metal line M3. In an embodiment, the plasma B is, for example, a fluorine-containing plasma produced by a fluorine-containing gas such as $CF_4$, $CHF_3$, or $SF_6$.

Figure 3D:
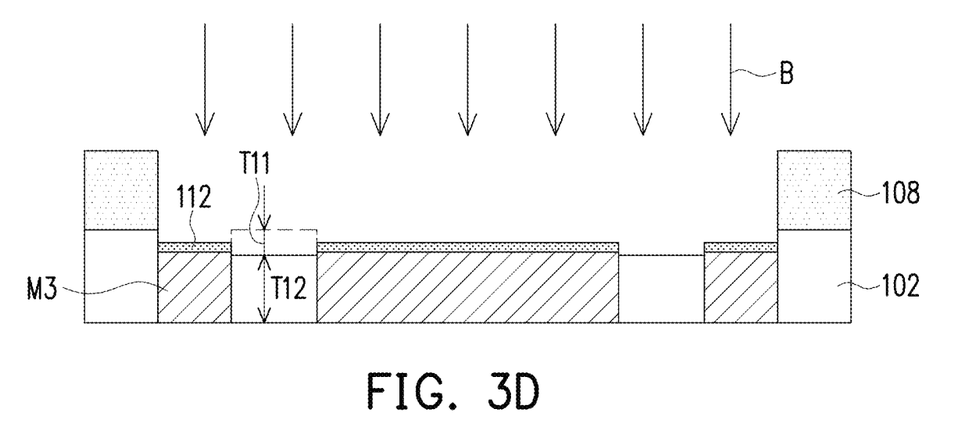

Referring to FIG. 3C and FIG. 3D, in an embodiment, the second etching process firstly removes the hard skin layer 110 overlying the surface of the dielectric layer 102, and then removes a portion of the dielectric layer 102. The dielectric layer 102 is removed by a thickness T11 which is smaller than the initial thickness T10, and the remained dielectric layer 102 has a thickness T12. In the embodiment of the disclosure, the introduction duration of the plasma A in the first etching process is controlled to be within a suitable range, thereby making the hard skin layer 110 can be easily removed by the plasma B in the second etching process without hindering the proceeding of the etching process.

Referring to FIG. 3D, in an embodiment, during the etching of the dielectric layer 102 using the plasma B, the metal line M3 is also exposed to the plasma B, and a hard skin layer 112 may be formed on the surface of the metal line M3. The hard skin layer 112 may include a product of the reaction of plasma B and the metal line M3 and a byproduct of the etching of the second etching process. A small amount of hard skin layer 112 can be easily removed in the subsequent first etching process of the metal line M3. However, as the introduction duration of the plasma B increases, that is, the duration of the second etching process increases, the size and removal difficulty of the hard skin layer 112 also increases. If the hard skin layer 112 cannot be removed successfully, it will hinder the subsequent etching process, thereby increasing the difficulty of the process. Therefore, it is necessary to control the introduction duration of the plasma B within a suitable range, so that the hard skin layer 112 generated on the metal line M3 can be successfully removed in the subsequent etching process without hindering the proceeding of the etching process. In an embodiment, the suitable range of the introduction duration of the plasma B, that is, the duration of the second etching process, is less than 20 seconds, less than 30 seconds, or less than 50 seconds.

Figure 3E:
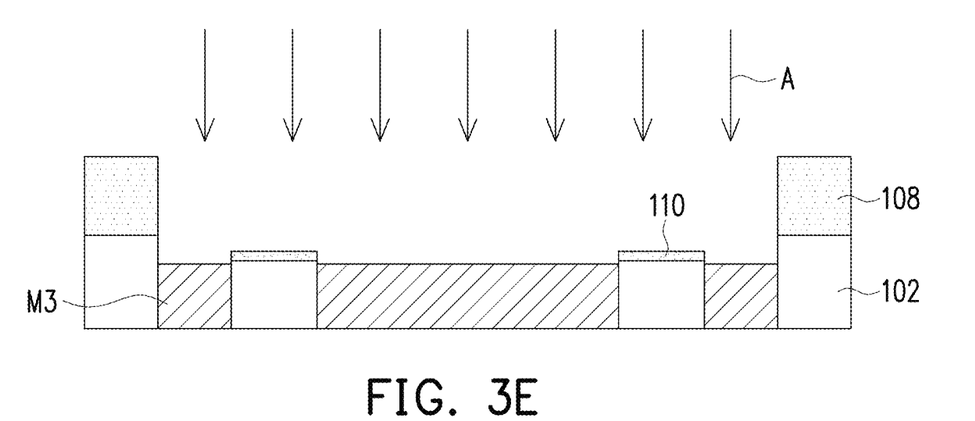
Figure 3F:
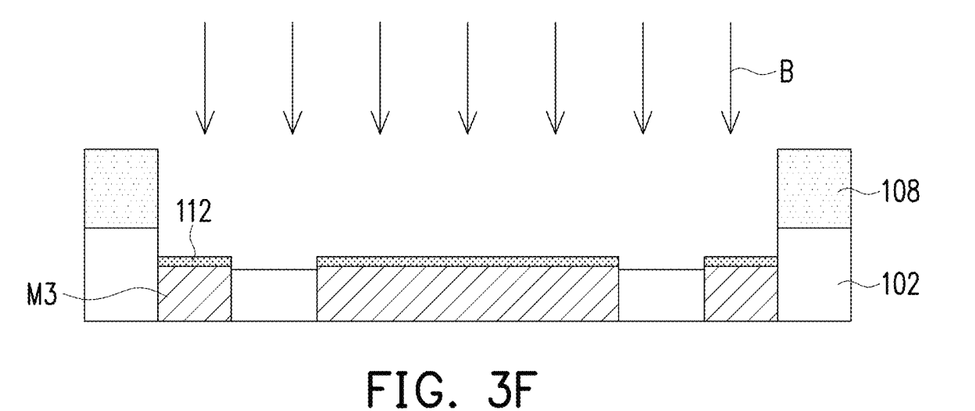

In an embodiment, the first etching process illustrated in FIG. 3A to FIG. 3B and the second etching process illustrated in FIG. 3C to FIG. 3D are referred to as one etching cycle. The etching cycle alternately performs the first etching process on the test structure TG (such as the metal line M3) and the second etching process on the dielectric layer 102 by rapidly switching the etching gas. FIG. 3A to FIG. 3D illustrate the first etching cycle. FIG. 3E to FIG. 3F illustrates the next etching cycle, that is, the second etching cycle.

Referring to FIG. 3D to FIG. 3E, stop introducing the plasma B, and the plasma A is introduced to perform the first etching process on the metal line M3. In the second etching cycle, the first etching process firstly removes the hard skin layer 112 on the metal line M3, and then further removes a portion of the metal line M3. Similar to that shown in FIG. 2B, the first etching process in this etching cycle also produces a hard skin layer 110 on the dielectric layer 102. In an embodiment, the introduction duration of the plasma A in this etching cycle may be the same as or different from the introduction duration of the plasma A in the last etching cycle, but both are within the suitable duration range described above, so that the hard skin layer 110 can be successfully removed in the subsequent second etching process.

Referring to FIG. 3E to FIG. 3F, stop introducing the plasma A, and the plasma B is introduced to perform the second etching process on the dielectric layer 102. The second etching process removes the hard skin layer 110 on the dielectric layer 102 and a portion of the dielectric layer 102. The introduction of plasma B may also produce a hard skin layer 112 on the metal line M3. The introduction duration of the plasma B in this etching cycle may be the same as or different from the introduction duration of the plasma B in the last etching cycle, but both are within the suitable time range described above, so that the hard skin layer 112 can be successfully removed in the subsequent etching process.

Referring to FIG. 2B to FIG. 2C, the above etching cycles are performed for a plurality of times, so as to completely remove the metal line M3 and the dielectric layer 102. In an embodiment, the thicknesses of the metal line and the dielectric layer removed in respective etching cycle may be the same or different. In an embodiment, five etching cycles are required to remove the metal line M3 and the dielectric layer 102 surrounding the metal line M3, for example. The number of the etching cycles is related to the thickness of the metal line.

Referring to FIG. 2C, after a plurality of etching cycles are performed, the metal line M3 and the dielectric layer 102 around thereof are removed, and the via V3 is exposed. Although the top surface of the remained dielectric layer 102 is illustrated to be level with the via V3 in FIG. 1C, the disclosure is not limited thereto. The top surface of the remained dielectric layer 102 and the top surface of the via V3 may be at different levels. For example, the top surface of the remained dielectric layer 102 may be higher or lower than the top surface of the via V3.

Referring to FIG. 2C to FIG. 2D, continue to performing a plurality of the above etching cycles to remove the remained vias and metal lines of the test structure TG and the dielectric layer 102, until the substrate 100 is exposed. The first etching process in each etching cycle removes the via, the metal line, or a combination thereof in the test structure TG, and the second etching process in each etching cycle removes the dielectric layer 102. The durations of the first etching process and the second etching process are respectively controlled within the above-mentioned suitable ranges, to facilitate the smooth progress of the etching process. In other words, the switching frequency of the first etching process and the second etching process (for example, the switching frequency of the etching gas) is switching per less than 20 seconds, less than 30 seconds, or less than 50 seconds. In an embodiment, multiple etching cycles are required to remove each layer of the metal line or each layer of the via in the test structure TG and the dielectric layer around thereof. In other words, the times of the etching cycles required to remove the test structures TG and the dielectric layers 102 is greater than the number of the layers of metal lines and vias in the test structure TG and the number of the layers of the dielectric layer 102.

In an embodiment, during the etching process of the test structure TG and the dielectric layer 102, a portion of the substrate 100 may also be removed, and the exposed substrate 100 may have an uneven surface.

In the above embodiment, the test structure TG and the dielectric layer 102 are removed by plasma etching, but the disclosure is not limited thereto. In alternative embodiments, other types of etching methods may be used to perform the removal processes of the test structure TG and the dielectric layer 102 in a similar manner. For example, the removal processes may be performed by a plurality of etching cycles of wet etching, wherein the first etching process uses an etchant such as a mixed acid of acetic acid, phosphoric acid and nitric acid, or hot hydrogen peroxide, so as to remove the test structure TG, and the second etching process uses an etchant such as hydrofluoric acid to remove the dielectric layer 102, for example. A plurality of etching cycles of the first etching process and the second etching process are performed until the substrate 100 is exposed.

Figure 2E:
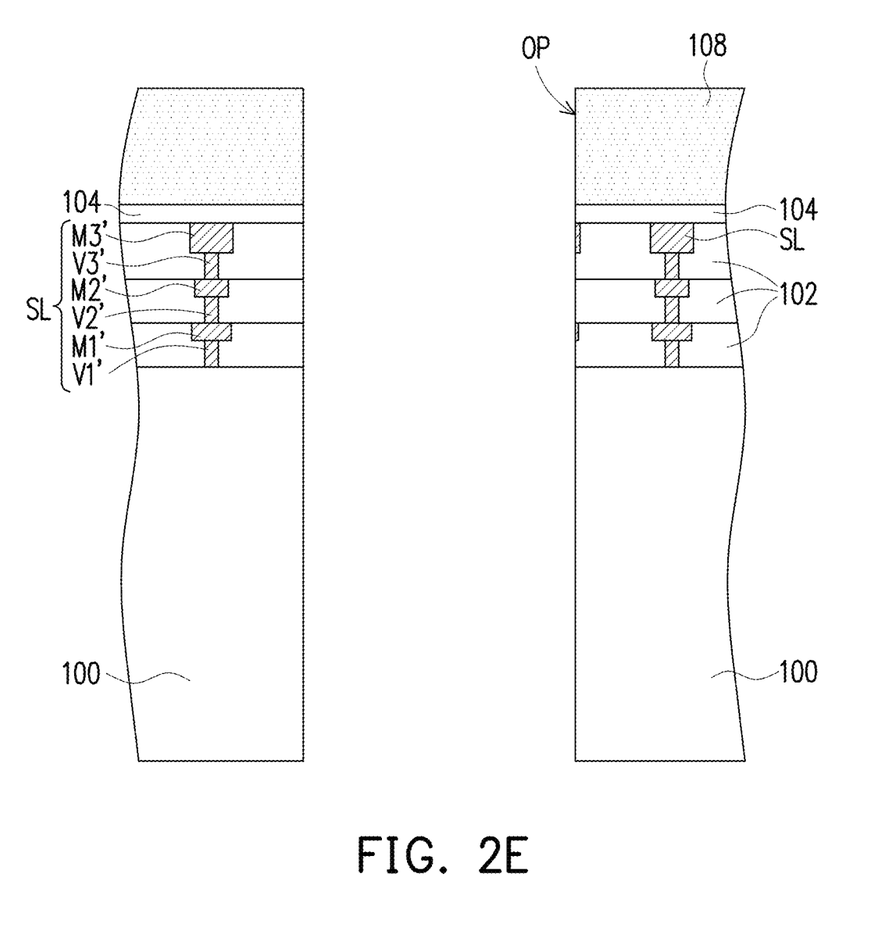

Referring to FIG. 2D to FIG. 2E, thereafter, a second removal process is performed with the patterned mask layer 108 as a mask, so as to remove the exposed substrate 100 in the scribe region SR. In an embodiment, the removal process of the substrate 100 includes a plasma dicing process. The plasma dicing process may include a plurality of etching-deposition-cleaning cycles, which may be referred to as a Bosch process. The plasma dicing process may be performed until the exposed substrate 100 in the scribe region SR is completely removed, but the disclosure is not limited thereto. In another embodiment, the plasma dicing process removes a portion of the substrate 100 in the scribe region SR, and a grinding process is then performed from the backside of the wafer W, such that another portion of substrate 100 in the scribe region SR is removed, and the substrate 100 in the die region DR 100 is thinned.

Figure 2F:
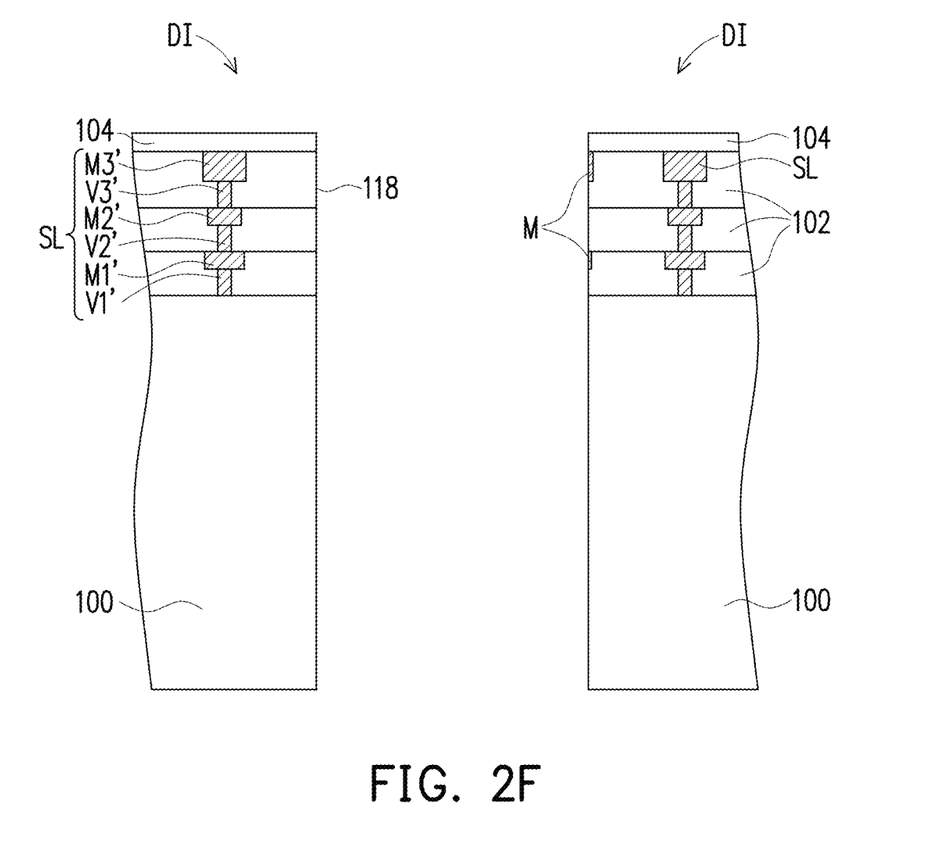

Referring to FIG. 2E and FIG. 2F, the patterned mask layer 108 is removed. The wafer dicing process is thus completed and a plurality of individual dies DI are formed.

In an embodiment, the metal features such as the vias and the metal lines in the test structure TG are completely removed during the wafer dicing process. In another embodiment, a portion of the metal features M in the test structure TG is not removed and remained in the die DI. The metal features M are electrically floating, and therefore would not adversely affect the die DI.

Figure 4:
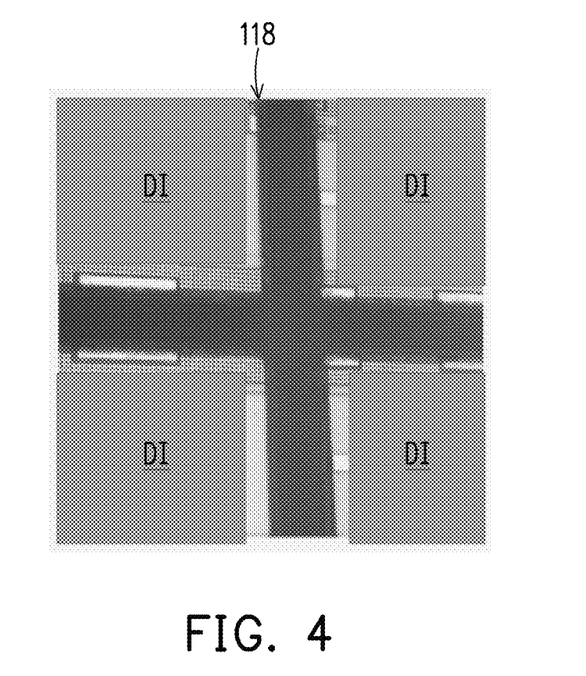
FIG. 4 illustrates a SEM image of a die cut from a wafer according to some embodiments of the disclosure.

Referring to FIG. 2F, in the embodiments of the disclosure, wafer dicing is performed by plasma etching method, so that the resulted die DI has a substantially flat sidewall 118, thereby increasing the strength of the die DI. FIG. 4 shows a top SEM image of the sidewall of the die after the wafer dicing is completed. In an embodiment, the side wall 118 of the die DI has a flat and smooth surface. For example, the surface roughness of the sidewall 118 of the die DI may be less than 2 μm. In some embodiments, the surface roughness refers to the sidewall roughness (scallop) of the sidewall 118.

In summary, the disclosure utilizes the plasma etching processes during which the etching plasmas are switched rapidly, so as to perform the wafer dicing, which can quickly and easily remove the complex test structure in the scribe region, and can make the die cut from the wafer have a flat sidewall. As such, the strength of the die is increased, and the die is able to withstand greater stress, so as to avoid cracking. On the other hand, through rapidly switching the etching plasma, the hard skin layer generated by the etching can be easily removed, thereby allowing the etching process to proceed smoothly.

Although the disclosure has been described with reference to the above embodiments, the disclosure is not limited to the embodiments, it will be apparent to one of ordinary skill in the art that modifications to the described embodiments may be made without departing from the spirit of the disclosure. Accordingly, the scope of the disclosure is defined by the attached claims.

What is claimed is:

1. A method of wafer dicing, comprising:
providing a wafer, the wafer comprises a plurality of die regions and a scribe region between the plurality of die regions, the scribe region comprises a substrate, and a dielectric layer and a test structure on the substrate, the test structure is disposed in the dielectric layer;
performing a first removal process, to remove the test structure and the dielectric layer around the test structure, and expose the substrate, the first removal process comprises performing a plurality of etching cycles, wherein each of the plurality of etching cycles comprises:
performing a first etching process to remove a portion of the test structure; and
performing a second etching process to remove a portion of the dielectric layer;
performing a second removal process to remove the substrate in the scribe region, and form a plurality of dies separated from each other.

2. The method of wafer dicing of claim 1, wherein during the first etching process, a first hard skin layer is formed on the dielectric layer, the first hard skin layer comprises a byproduct of the first etching process, and the first hard skin layer is removed by the second etching process.

3. The method of wafer dicing of claim 1, wherein during the second etching process, a second hard skin layer is formed on the test structure, the second hard skin layer comprises a byproduct of the second etching process, and the second hard skin layer is removed by the first etching process.

4. The method of wafer dicing of claim 1, wherein a duration of the first etching process in each of the plurality of etching cycles is less than 50 seconds, and a duration of the second etching process in each of the plurality of etching cycles is less than 50 seconds.

5. The method of wafer dicing of claim 1, wherein the test structure comprises multilayers of vias and metal lines stacked alternately, wherein a number of layers of the vias and the metal lines is less than a number of times of the etching cycles.

6. The method of wafer dicing of claim 1, wherein the first etching process and the second etching process comprise plasma dry etching, wet etching, or a combination thereof, respectively.

7. The method of wafer dicing of claim 1, wherein the first etching process uses a chlorine-containing plasma to remove the test structure, the second etching process uses a fluorine-containing plasma to remove the dielectric layer.

8. The method of wafer dicing of claim 1, further comprises:
forming a patterned mask layer on the die region and a portion of the scribe region of the wafer before performing the first removal process, the patterned mask layer has an opening, exposing another portion of the scribe region, wherein the first removal process and the second removal process are performed with the patterned mask layer as a mask; and
removing the patterned mask layer after performing the second removal process.

9. The method of wafer dicing of claim 1, wherein a removed scribe region has a width in a range of 10 µm to 60 µm or 10 µm to 70 µm.

10. A die cut from the wafer using the method of wafer dicing of claim 1, wherein a sidewall of the die has a flat surface.

11. The method of wafer dicing of claim 8, further comprises removing a protection layer on the test structure and the dielectric layer to expose a top surface of the test structure and a top surface of the dielectric layer, after forming the patterned mask layer and before performing the first removal process.

12. The die of claim 10, wherein the sidewall of the die has a surface roughness less than 2 µm.

* * * * *